United States Patent
Chen et al.

(10) Patent No.: US 10,288,950 B1
(45) Date of Patent: May 14, 2019

(54) DISPLAY PANEL AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Nan Chen, Beijing (CN); Yongzhi Song, Beijing (CN); Dong Wang, Beijing (CN); Jiyu Wan, Beijing (CN); Sikai Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/011,344

(22) Filed: Jun. 18, 2018

(30) Foreign Application Priority Data

Dec. 5, 2017 (CN) .......................... 2017 1 1265680

(51) Int. Cl.
| | |
|---|---|
| *H05K 1/00* | (2006.01) |
| *G02F 1/1339* | (2006.01) |
| *H05K 1/14* | (2006.01) |
| *G02F 1/1335* | (2006.01) |
| *G02F 1/1343* | (2006.01) |

(52) U.S. Cl.
CPC .... *G02F 1/13394* (2013.01); *G02F 1/133512* (2013.01); *G02F 1/134309* (2013.01); *H05K 1/144* (2013.01); *H05K 2201/042* (2013.01); *H05K 2201/10083* (2013.01)

(58) Field of Classification Search
CPC .......... G02F 1/13394; G02F 1/133512; G02F 1/134309; H05K 1/144; H05K 2201/042; H05K 2201/10083
See application file for complete search history.

(56) References Cited

U.S. PATENT DOCUMENTS

| | | | | |
|---|---|---|---|---|
| 2009/0160462 A1* | 6/2009 | Harish | ................ | B60C 23/0408 324/686 |
| 2015/0363016 A1* | 12/2015 | Furutani | .................. | G09G 3/36 345/173 |
| 2018/0059486 A1* | 3/2018 | Matsushima | ..... | G02F 1/133512 |

* cited by examiner

*Primary Examiner* — Pete T Lee
(74) *Attorney, Agent, or Firm* — Kinney & Lange, P.A.

(57) ABSTRACT

A display panel includes first and second substrates and a control module. The first substrate includes first electrodes and electrostriction parts on the first electrodes. The second substrate includes second electrodes and spacers on the second electrodes. Orthogonal projections of the first and second electrodes on the first substrate overlap in overlap regions, and the electrostriction parts are disposed in the overlap regions. When the display panel receives an external force in a force receiving location, the control module determines at least one of the electrostriction parts corresponding to the force receiving location, and changes a voltage between at least one of the first electrodes and at least one of the second electrodes corresponding to the at least one of the electrostriction parts, so as to control the at least one of the electrostriction parts to be extended or retracted.

15 Claims, 2 Drawing Sheets

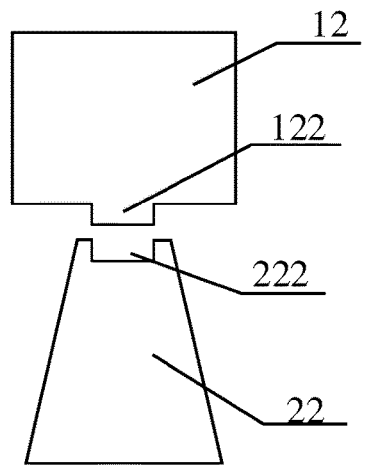

Fig. 4

| Determining, by the control module, at least one of the electrostriction parts corresponding to a force receiving location when the display panel receives an external force in the force receiving location | ← 100 |

| Changing, by the control module, a voltage between at least one of the first electrodes and at least one of the second electrodes corresponding to the at least one of the electrostriction parts, so as to control the at least one of the electrostriction parts to be extended or retracted | ← 200 |

Fig. 5

DISPLAY PANEL AND DISPLAY APPARATUS

CROSS-REFERENCE TO RELATED APPLICATION

This application claims the benefit of Chinese Patent Application No. 201711265680.X, filed with the State Intellectual Property Office of China on Dec. 5, 2017, the whole disclosure of which is incorporated herein by reference.

BACKGROUND

1. Technical Field

Embodiments of the present disclosure relate to a display panel and a display apparatus.

2. Description of the Related Art

A distance between two substrates in a liquid crystal display panel of a liquid crystal display apparatus is maintained mainly by spacers.

SUMMARY

Embodiments of the present disclosure provide a display panel comprising: a first substrate and a second substrate disposed opposite to each other, wherein the first substrate comprises: a plurality of first electrodes, and electrostriction parts respectively disposed on the plurality of first electrodes wherein the second substrate comprises: a plurality of second electrodes, and spacers respectively disposed on the plurality of second electrodes; wherein orthogonal projections of the plurality of first electrodes on the first substrate and orthogonal projections of the plurality of second electrodes on the first substrate overlap in a plurality of overlap regions on the first substrate, respectively; wherein the electrostriction parts are disposed in the plurality of overlap regions, respectively; wherein the electrostriction parts are in one-to-one correspondence with the spacers; and wherein ends, facing towards the second substrate, of the electrostriction parts are in contact with ends, facing towards the first substrate, of the spacers, respectively; and a control module respectively connected with the plurality of first electrodes and the plurality of second electrodes, and is configured such that, when the display panel receives an external force in a force receiving location thereof, the control module determines at least one of the electrostriction parts corresponding to the force receiving location, and changes a voltage between at least one of the first electrodes and at least one of the second electrodes corresponding to the at least one of the electrostriction parts, so as to control the at least one of the electrostriction parts to be extended or retracted.

According to embodiments of the present disclosure, the plurality of first electrodes have a strip shape and extend in a first direction, and the plurality of second electrodes have a strip shape and extend in a second direction crossing the first direction.

According to embodiments of the present disclosure, the first direction is perpendicular to the second direction.

According to embodiments of the present disclosure, the first substrate comprises a black matrix; and the orthogonal projections of the plurality of first electrodes on the first substrate and the orthogonal projections of the plurality of second electrodes on the first substrate are located within an orthogonal projection of the black matrix of the first substrate on the first substrate.

According to embodiments of the present disclosure, the spacers of the second substrate have a same height.

According to embodiments of the present disclosure, the ends of the electrostriction parts and the ends of the spacers which are in contact with one another are engaged with one another, respectively.

According to embodiments of the present disclosure, the electrostriction parts have first recesses, respectively, and the first recesses are formed in the ends of the electrostriction parts which are in contact with the ends of the spacers, respectively; the spacers have first protrusions, respectively, and the first protrusions are located on the ends of the spacers which are in contact with the ends of the electrostriction parts, respectively; and the first recesses and the first protrusions match one another and are engaged with one another, respectively.

According to embodiments of the present disclosure, the electrostriction parts have first recesses, respectively, and the first recesses are formed in the ends of the electrostriction parts which are in contact with the ends of the spacers, respectively; the first recesses, and the ends of the spacers which are in contact with the ends of the electrostriction parts match one another and are engaged with one another, respectively.

According to embodiments of the present disclosure, the electrostriction parts have second protrusions, respectively, and the second protrusions are located on the ends of the electrostriction parts which are in contact with the ends of the spacers, respectively; the spacers have second recesses, respectively, and the second recesses are formed in the ends of the spacers which are in contact with the ends of the electrostriction parts, respectively; and the second protrusions and the second recesses match one another and are engaged with one another, respectively.

According to embodiments of the present disclosure, the electrostriction parts are made of one of nano-barium titanate, polyurethane complex, and ceramics, or any combination thereof.

According to embodiments of the present disclosure, the electrostriction parts have a column shape.

According to embodiments of the present disclosure, the control module is further configured to: detect changes of capacitances of capacitors respectively formed by the plurality of first electrodes and the plurality of second electrodes in the plurality of overlap regions, and determine the at least one of the electrostriction parts corresponding to the force receiving location according to a position where at least one, of which the capacitance is changed, of the capacitors is located.

Embodiments of the present disclosure further provide a display apparatus comprising the above display panel.

Embodiments of the present disclosure further provide a method of controlling the above display panel, the method comprising: determining, by the control module, at least one of the electrostriction parts corresponding to a force receiving location of the display panel when the display panel receives an external force in the force receiving location; and changing, by the control module, a voltage between at least one of the first electrodes and at least one of the second electrodes corresponding to the at least one of the electrostriction parts, so as to control the at least one of the electrostriction parts to be extended or retracted.

According to embodiments of the present disclosure, determining, by the control module, the at least one of the electrostriction parts corresponding to the force receiving location comprises: detecting, by the control module, changes of capacitances of capacitors respectively formed by the plurality of first electrodes and the plurality of second electrodes in the plurality of overlap regions; and determining, by the control module, the at least one of the electrostriction parts corresponding to the force receiving location according to a position where at least one, of which the capacitance is changed, of the capacitors is located.

BRIEF DESCRIPTION OF THE DRAWINGS

FIG. 4 is a schematic diagram of structures of an electrostriction part and a spacer fitting in with each other, according to another embodiment of the present disclosure; and FIG. 5 is a flow diagram of a method of controlling a display panel, according to an embodiment of the present disclosure.

DETAILED DESCRIPTION OF THE EMBODIMENTS

A clear and complete description of technical solutions in embodiments of the present disclosure will be made as below in conjunction with the accompanying drawings in the embodiments of the present disclosure. Apparently, the described embodiments are some of the embodiments of the present disclosure rather than all of the embodiments of the present disclosure. All other embodiments derived by those skilled in the art based on the embodiments of the present disclosure without making a creative work shall fall within the protection scope of the present disclosure.

Figure 1:
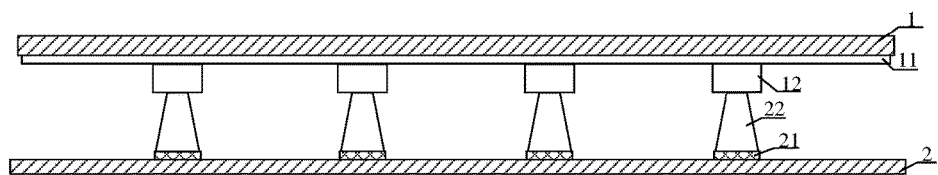
FIG. 1 is a schematic diagram showing a configuration of a display panel according to an embodiment of the present disclosure, comprising a first substrate and a second substrate.

FIG. 1 is a schematic diagram showing a configuration of a display panel according to an embodiment of the present disclosure, comprising a first substrate and a second substrate. Referring to FIG. 1, a display panel according to an embodiment of the present disclosure comprises a first substrate 1 and a second substrate 2 disposed opposite to each other. The first substrate 1 comprises a plurality of first electrodes 11, and electrostriction parts 12 respectively disposed on the plurality of first electrodes 11. The second substrate 2 comprises a plurality of second electrodes 21, and spacers 22 respectively disposed on the plurality of second electrodes 21.

Orthogonal projections of the plurality of first electrodes 11 on the first substrate 1 and orthogonal projections of the plurality of second electrodes 21 on the first substrate 1 overlap in a plurality of overlap regions on the first substrate 1, respectively, and the electrostriction parts 12 are disposed in the plurality of overlap regions, respectively. The electrostriction parts 12 are in one-to-one correspondence with the spacers 22, and ends, facing towards the second substrate 2, of the electrostriction parts 12 are in contact with ends, facing towards the first substrate 1, of the spacers 22, respectively.

The display panel further comprises a control module. The control module is connected with the plurality of first electrodes 11 and the plurality of second electrodes 21, respectively, and is configured such that, when the display panel receives an external force in a force receiving location of the display panel, the control module determines at least one of the electrostriction parts 12 corresponding to the force receiving location, and changes a voltage between at least one of the first electrodes 11 and at least one of the second electrodes 21 corresponding to the at least one of the electrostriction parts 12, so as to control the at least one of the electrostriction parts 12 to be extended or retracted.

In the display panel according to the embodiment of the present disclosure, the first substrate 1 comprises the electrostriction parts 12, the electrostriction parts 12 are in one-to-one correspondence with and in contact with the spacers 22 of the second substrate 2, and the plurality of first electrodes 11 of the first substrate 1 and the plurality of second electrodes 21 of the second substrate 2 are disposed to control at least one of the electrostriction parts 12 to be extended or retracted. When the display panel receives an external force, at least one of the electrostriction parts 12 is controlled to be extended or retracted so as to adjust a supporting force exerted by at least one of the spacers 22 in a position corresponding to the at least one of the electrostriction parts 12. As a result, it can be effectively ensured that a distance between the first substrate and the second substrate is uniform.

According to embodiments of the present disclosure, the electrostriction parts 12 have a column shape, such as a circular cylindrical shape, a shape of truncated cone, or a shape of truncated circular cone. The spacers 22 may have a column shape.

According to embodiments of the present disclosure, the control module is further configured to: detect changes of capacitances of capacitors respectively formed by the plurality of first electrodes 11 and the plurality of second electrodes 21 in the plurality of overlap regions, and determine the at least one of the electrostriction parts 12 corresponding to the force receiving location according to a position where at least one, of which the capacitance is changed, of the capacitors is located.

Specifically, the plurality of first electrodes 11 have a strip shape and extend in a first direction, and the plurality of second electrodes 21 have a strip shape and extend in a second direction crossing the first direction, so that orthogonal projections of the plurality of first electrodes 11 on the first substrate and orthogonal projections of the plurality of second electrodes 21 on the first substrate overlap in a plurality of overlap regions on the first substrate, respectively, and the electrostriction parts 12 are located in the plurality of overlap regions, respectively. For example, the first direction is perpendicular to the second direction, and the first direction is parallel to a direction in which a gate line of the first substrate extends, while the second direction is parallel to a direction in which a data line of the first substrate extends, or the first direction is parallel to the direction in which the data line of the first substrate extends, while the second direction is parallel to the direction in which the gate line of the first substrate extends.

Figure 2:
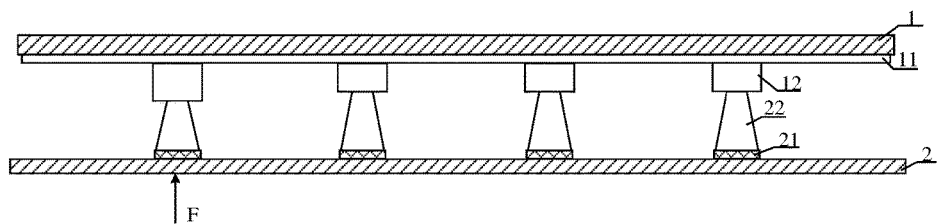
FIG. 2 is a schematic diagram showing a display panel according to an embodiment of the present disclosure, in a state where it is compressed by an external force.

In this way, referring to FIG. 2, when the display panel receives an external force F in a force receiving location of the display panel, a distance between the first substrate 1 and the second substrate 2 at the force receiving location is changed. The change of the distance between the first substrate and the second substrate causes a change of a capacitance of at least one, in the force receiving location, of capacitors respectively formed by the plurality of first electrodes 11 and the plurality of second electrodes 21 in the plurality of overlap regions. In this case, the control module detects a change of a value of the capacitance, and determines the at least one of the electrostriction parts 12 corresponding to the force receiving location according to a position where at least one, of which the capacitance is changed, of the capacitors is located. Then, the control module changes a voltage between at least one of the first electrodes 11 and at least one of the second electrodes 21 corresponding to the at least one of the electrostriction parts 12 by controlling a peripheral circuit, and thus changes an electric field in a position where the at least one of the electrostriction parts 12 is located, so as to control the at least one of the electrostriction parts 12 to be extended or retracted. According to embodiments of the present disclosure, the force receiving location may correspond to one or more of the electrostriction parts 12. As shown in FIG. 2, when the substrate receives an external force F in a left position, a distance between at least one of the first electrodes 11 and at least one of the second electrodes 21 corresponding to at least one of the electrostriction parts 12 located in the left position is decreased, thereby causing an increase of a capacitance of a capacitor formed by the at least one of the first electrodes 11 and the at least one of the second electrodes 21 in the overlap region. After detecting the increase of the capacitance of the capacitor in the left position, the control module controls a peripheral circuit to increase a voltage between the at least one of the first electrodes 11 and at least one of the second electrodes 21, and thus to increase an intensity of an electric field in the left position where the at least one of the electrostriction parts 12 is located. The at least one of the electrostriction parts 12 located in the left position is extended, so as to increase a supporting force of at least one of the spacers 22 corresponding to the at least one of the electrostriction parts 12, avoiding a decrease of the distance between the first substrate and the second substrate when receiving the pressing force, and thus ensuring a uniformity of the distance between the first substrate and the second substrate of the entire display panel.

In the embodiments of the present disclosure, in order not to decrease an aperture ratio of the display panel, the orthogonal projections of the plurality of first electrodes 11 on the first substrate 1 and the orthogonal projections of the plurality of second electrodes 21 on the first substrate 1 are located within an orthogonal projection of the black matrix of the first substrate 1 on the first substrate 1.

According to embodiments of the present disclosure, the spacers 22 of the second substrate 2 have a same height, thereby reducing a difficulty of manufacture of the spacers 22.

In the embodiments of the present disclosure, the spacers 22 have the same height, and the electrostriction parts 12 are disposed in positions corresponding to the spacers 22, respectively. Supporting forces of the spacers 22 can be effectively ensured by controlling the electrostriction parts 12 to be extended or retracted, thereby guaranteeing a uniformity of the distance between the first substrate and the second substrate of the display panel. Therefore, with the display panel according to the embodiments of the present disclosure, occurrence of defects such as a gravity mura phenomenon can be effectively avoided, and a manufacturing process of the spacers 22 is simplified.

In an embodiment of the present disclosure, in order to prevent a possible occurrence of an offset between the electrostriction part 12 and the spacer 22 when the display panel receives an external force, the ends of the electrostriction parts 12 and the ends of the spacers 22 which are in contact with one another are engaged with one another, respectively. Engagement structures matching each other are disposed at the end of the electrostriction part 12 and the end of the spacer 22 which are in contact with each other.

Figure 3:
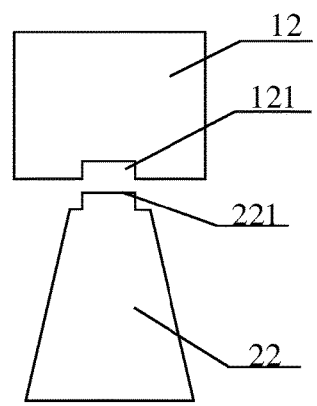
FIG. 3 is a schematic diagram of structures of an electrostriction part and a spacer fitting in with each other, according to an embodiment of the present disclosure.

Specifically, referring to FIG. 3 and FIG. 4, the electrostriction parts 12 have first recesses 121, respectively, and the first recesses 121 are formed in the ends of the electrostriction parts 12 which are in contact with the ends of the spacers 22, respectively; the spacers 22 have first protrusions 221, respectively, and the first protrusions 221 are located on the ends of the spacers 22 which are in contact with the ends of the electrostriction parts 12, respectively; and the first recesses 121 and the first protrusions 221 match one another and are engaged with one another, respectively. Thereby, the ends of the electrostriction parts 12 and the ends of the spacers 22 are engaged with one another, respectively. Alternatively, the electrostriction parts 12 have second protrusions 122, respectively, and the second protrusions 122 are located on the ends of the electrostriction parts 12 which are in contact with the ends of the spacers 22, respectively; the spacers 22 have second recesses 222, respectively, and the second recesses 222 are formed in the ends of the spacers 22 which are in contact with the ends of the electrostriction parts 12, respectively; and the second protrusions 122 and the second recesses 222 match one another and are engaged with one another, respectively. Thereby, the ends of the electrostriction parts 12 and the ends of the spacers 22 are engaged with one another, respectively. Of course, the electrostriction parts 12 and the spacers 22 may also be fixed in any other manner, thereby avoiding an occurrence of an offset between the electrostriction part 12 and the spacer 22. According to an example of the present disclosure, the electrostriction parts 12 have first recesses 121, respectively, and the first recesses 121 are formed in the ends of the electrostriction parts 12 which are in contact with the ends of the spacers 22, respectively; and the first recesses 121, and the ends of the spacers 22 which are in contact with the ends of the electrostriction parts 12 match one another and are engaged with one another, respectively. Recesses are formed in the ends of the electrostriction parts 12 which are in contact with the ends of the spacers 22, respectively, and the ends of the spacers 22 which are in contact with the ends of the electrostriction parts 22 are located in the recesses, respectively, thereby avoiding an occurrence of an offset between the electrostriction part 12 and the spacer 22. The manner of fixing the electrostriction part 12 and the spacer 22 is not limited to those described in the embodiments.

The electrostriction parts 22 in the above embodiments may be specifically made of one of nano-barium titanate, polyurethane complex, and ceramics, or any combination thereof. The material of the electrostriction part 12 is not limited to those described in the embodiments.

In the display panel according to the above embodiments, the spacers of the second substrate are manufactured to have a same height. Therefore, occurrence of defects such as a gravity mura phenomenon can be effectively avoided, and a manufacturing process of the spacers is simplified. In addition, the spacers are in correspondence with the electrostriction parts of the first substrate. By changing a voltage between at least one of the first electrodes and at least one of the second electrodes corresponding to at least one of the electrostriction parts, an electric field where the at least one of the electrostriction parts is located is changed, so as to control the at least one of the electrostriction parts to be extended or retracted. Thereby, a supporting force of at least one of the spacers is adjusted to ensure a uniformity of the distance between the first substrate and the second substrate of the display panel, avoiding problems, such as a poor display, caused due to a nonuniformity of the distance between the first substrate and the second substrate.

Embodiments of the present disclosure further provide a method of controlling a display panel, for example a method of controlling the display panel described in the above embodiments. Referring to FIG. 5, the method comprises a step 100 of determining, by the control module, at least one of the electrostriction parts corresponding to a force receiving location when the display panel receives an external force in the force receiving location of the display panel.

Determining, by the control module, the at least one of the electrostriction parts corresponding to the force receiving location comprises: detecting, by the control module, changes of capacitances of capacitors respectively formed by the plurality of first electrodes and the plurality of second electrodes in the plurality of overlap regions; and determining, by the control module, the at least one of the electrostriction parts corresponding to the force receiving location according to a position where at least one, of which the capacitance is changed, of the capacitors is located. Specifically, referring to FIG. 2, when the display panel receives an external force F in a force receiving location, a distance between the first substrate 1 and the second substrate 2 at the force receiving location is changed. The change of the distance between the first substrate and the second substrate causes a change of a capacitance of at least one, in the force receiving location, of capacitors respectively formed by the plurality of first electrodes 11 and the plurality of second electrodes 21 in the plurality of overlap regions. In this case, the control module detects a change of a value of the capacitance of the at least one of the capacitors, and determines the at least one of the electrostriction parts 12 corresponding to the force receiving location according to a position where the at least one, of which the capacitance is changed, of the capacitors is located. According to an example of the present disclosure, the force receiving location may correspond to one or more of the electrostriction parts 12.

The method further comprises a step 200 of changing, by the control module, a voltage between at least one of the first electrodes and at least one of the second electrodes corresponding to the at least one of the electrostriction parts, so as to control the at least one of the electrostriction parts to be extended or retracted.

Specifically, referring to FIG. 2, the control module changes a voltage between at least one of the first electrodes 11 and at least one of the second electrodes 21 corresponding to the at least one of the electrostriction parts 12 by controlling a peripheral circuit, and thus changes an electric field in a position where the at least one of the electrostriction parts 12 is located, so as to control the at least one of the electrostriction parts to be extended or retracted.

As shown in FIG. 2, when the substrate receives an external force F in a left position, a distance between at least one of the first electrodes 11 and at least one of the second electrodes 21 corresponding to at least one of the electrostriction parts 12 located in the left position is decreased, thereby causing an increase of a capacitance of a capacitor formed by the at least one of the first electrodes 11 and the at least one of the second electrodes 21 in the overlap region. After detecting the increase of the capacitance of the capacitor in the left position, the control module controls a peripheral circuit to increase a voltage between the at least one of the first electrodes 11 and the at least one of the second electrodes 21, and thus increase an intensity of an electric field in the left position where the at least one of the electrostriction parts 12 is located. The at least one of the electrostriction parts 12 located in the left position is extended, so as to increase a supporting force of at least one of the spacers 22 corresponding to the at least one of the electrostriction parts 12, avoiding a decrease of the distance between the first substrate and the second substrate when receiving the pressing force, and thus ensuring a uniformity of the distance between the first substrate and the second substrate of the entire display panel.

As described above, with the method of controlling the display panel according to the above embodiments, when the display panel receives an external force in a force receiving location of the display panel, at least one of the electrostriction parts 12 corresponding to the force receiving location can be effectively controlled to be extended or retracted. Thereby, a supporting force of at least one of the spacers is adjusted to ensure a uniformity of the distance between the first substrate and the second substrate of the display panel, avoiding problems, such as a poor display, caused due to a nonuniformity of the distance between the first substrate and the second substrate.

Embodiments of the present disclosure further provide a display apparatus comprising the display panel according to any one of the abovementioned embodiments. The display apparatus may comprise any products or parts having a displaying function, such as a mobile phone, a tablet computer, a TV, a display, a notebook computer, a digital frame, a navigator, and an electronic paper.

The display apparatus may comprise a liquid crystal display apparatus, a light emitting diode (LED) display apparatus, an organic light emitting diode (OLED) display apparatus, a quantum dot light emitting diode (QLED) display apparatus, and the like.

These embodiments of the description are described in a progressive manner. The contents mainly described in each of the embodiments are different from those mainly described in other embodiments. For contents that are not described in an embodiment, those described in another embodiment may be referred to.

Apparently, various changes and modifications to the present disclosure may be made by those skilled in the art without departing from the spirit and scope of the disclosure. Therefore, if these changes and modifications to the present disclosure belong to the scope defined in the appended claims of the present disclosure and their equivalents, the present disclosure is intended to include the changes and modifications.

What is claimed is:

1. A display panel comprising:
    a first substrate and a second substrate disposed opposite to each other;
        wherein the first substrate comprises:
            a plurality of first electrodes; and
            electrostriction parts respectively disposed on the plurality of first electrodes;
        wherein the second substrate comprises:
            a plurality of second electrodes; and
            spacers respectively disposed on the plurality of second electrodes;
        wherein orthogonal projections of the plurality of first electrodes on the first substrate and orthogonal projections of the plurality of second electrodes on the first substrate overlap in a plurality of overlap regions on the first substrate, respectively;
        wherein the electrostriction parts are disposed in the plurality of overlap regions, respectively;
        wherein the electrostriction parts are in one-to-one correspondence with the spacers; and wherein ends, facing towards the second substrate, of the electrostriction parts are in contact with ends, facing towards the first substrate, of the spacers, respectively; and a control module respectively connected with the plurality of first electrodes and the plurality of second electrodes, and configured such that, when the display panel receives an external force in a force receiving location thereof, the control module determines at least one of the electrostriction parts corresponding to the force receiving location, and changes a voltage between at least one of the first electrodes and at least one of the second electrodes corresponding to the at least one of the electrostriction parts, so as to control the at least one of the electrostriction parts to be extended or retracted.

2. The display panel of claim 1, wherein:
the plurality of first electrodes have a strip shape and extend in a first direction, and the plurality of second electrodes have a strip shape and extend in a second direction crossing the first direction.

3. The display panel of claim 2, wherein:
the first direction is perpendicular to the second direction.

4. The display panel of claim 2, wherein:
the first substrate comprises a black matrix; and
the orthogonal projections of the plurality of first electrodes on the first substrate and the orthogonal projections of the plurality of second electrodes on the first substrate are located within an orthogonal projection of the black matrix of the first substrate on the first substrate.

5. The display panel of claim 1, wherein:
the spacers of the second substrate have a same height.

6. The display panel of claim 1, wherein:
the ends of the electrostriction parts and the ends of the spacers which are in contact with one another are engaged with one another, respectively.

7. The display panel of claim 1, wherein:
the electrostriction parts have first recesses, respectively, and the first recesses are formed in the ends of the electrostriction parts which are in contact with the ends of the spacers, respectively;
the spacers have first protrusions, respectively, and the first protrusions are located on the ends of the spacers which are in contact with the ends of the electrostriction parts, respectively; and
the first recesses and the first protrusions match one another and are engaged with one another, respectively.

8. The display panel of claim 1, wherein:
the electrostriction parts have first recesses, respectively, and the first recesses are formed in the ends of the electrostriction parts which are in contact with the ends of the spacers, respectively; and
the first recesses, and the ends of the spacers which are in contact with the ends of the electrostriction parts match one another and are engaged with one another, respectively.

9. The display panel of claim 1, wherein:
the electrostriction parts have second protrusions, respectively, and the second protrusions are located on the ends of the electrostriction parts which are in contact with the ends of the spacers, respectively;
the spacers have second recesses, respectively, and the second recesses are formed in the ends of the spacers which are in contact with the ends of the electrostriction parts, respectively; and
the second protrusions and the second recesses match one another and are engaged with one another, respectively.

10. The display panel of claim 1, wherein:
the electrostriction parts are made of one of nano-barium titanate, polyurethane complex, and ceramics, or any combination thereof.

11. The display panel of claim 1, wherein:
the electrostriction parts have a column shape.

12. The display panel of claim 1, wherein the control module is further configured to:
detect changes of capacitances of capacitors respectively formed by the plurality of first electrodes and the plurality of second electrodes in the plurality of overlap regions, and
determine the at least one of the electrostriction parts corresponding to the force receiving location according to a position where at least one, of which the capacitance is changed, of the capacitors is located.

13. A display apparatus comprising:
the display panel according to claim 1.

14. A method of controlling the display panel of claim 13, the method comprising:
determining, by the control module, at least one of the electrostriction parts corresponding to a force receiving location of the display panel when the display panel receives an external force in the force receiving location; and
changing, by the control module, a voltage between at least one of the first electrodes and at least one of the second electrodes corresponding to the at least one of the electrostriction parts, so as to control the at least one of the electrostriction parts to be extended or retracted.

15. The method of claim 14, wherein determining, by the control module, the at least one of the electrostriction parts corresponding to the force receiving location comprises:
detecting, by the control module, changes of capacitances of capacitors respectively formed by the plurality of first electrodes and the plurality of second electrodes in the plurality of overlap regions; and
determining, by the control module, the at least one of the electrostriction parts corresponding to the force receiving location according to a position where at least one, of which the capacitance is changed, of the capacitors is located.

* * * * *